United States Patent
Wigren

[11] Patent Number: 5,995,620
[45] Date of Patent: Nov. 30, 1999

[54] ECHO CANCELLER HAVING KALMAN FILTER FOR OPTIMAL ADAPTATION

[75] Inventor: Torbjörn Wigren, Uppsala, Sweden

[73] Assignee: Telefonaktiebolaget LM Ericsson, Stockholm, Sweden

[21] Appl. No.: 08/908,943

[22] Filed: Aug. 8, 1997

Related U.S. Application Data

[63] Continuation of application No. PCT/SE96/00178, Feb. 12, 1996.

[30] Foreign Application Priority Data

Feb. 15, 1995 [SE] Sweden .................................. 9500553

[51] Int. Cl.$^6$ ...................................................... H04M 1/00
[52] U.S. Cl. ........................................... 379/410; 379/406
[58] Field of Search .................................... 379/406, 410, 379/411; 370/286, 289, 290

[56] References Cited

U.S. PATENT DOCUMENTS

| | | |
|---|---|---|
| 4,677,668 | 6/1987 | Ardalan et al. . |
| 4,760,596 | 7/1988 | Agrawal et al. . |
| 5,408,530 | 4/1995 | Makino et al. . |
| 5,418,849 | 5/1995 | Cannalire et al. ........................ 379/410 |
| 5,734,715 | 3/1998 | Scalart et al. ........................ 379/911 X |

FOREIGN PATENT DOCUMENTS

| | | |
|---|---|---|
| 0 375 015 | 6/1990 | European Pat. Off. . |
| 06 113 027 | 4/1994 | Japan . |

OTHER PUBLICATIONS

G. Cherubini, "Analysis of the Convergence Behaviour of Adaptive Distributed–Arithmetic Echo Cancellers", IEEE Trans. on Communications, vol. 41, No. 11, pp. 1703–1714, (Nov. 1993).

L. Ljung et al, "Application of Fast Kalman Estimation to Adaptive Equalization", IEEE Trans. on Communications, vol. com–26, No. 10, pp. 1439–1446, (Oct. 1978).

E. Hänsler, "The hands–free telephone problem– an annotated bibliography", Signal Processing, vol. 27, No. 3, pp. 259–271, (1992).

H. Schütze et al., "Numerical characteristics of fast recursive least squares transversal adaptation algorithms—a comparative study", Signal Processing, vol. 27, No. 3, pp. 317–332, (1992).

S. Makino, et al., "Exponentially weighted stepsize NLMS adaptive filter based on the statistics of a room impulse response", IEEE Trans, Acoust. Speech, Audio Processing, vol. 1, No. 1, pp. 101–108, (Jan. 1993).

L. Lindbom, "Simplified Kalman estimation of fading mobile radio channels: high performance at LMS computational load", in Proc. ICASSP, Pt. III, pp. 352–355, (1993).

S. Haykin, Modern Filters, Macmillan Publishing, pp. 349–359, (1989).

*Primary Examiner*—Creighton Smith
*Attorney, Agent, or Firm*—Burns, Doane, Swecker & Mathis, L.L.P.

[57] ABSTRACT

Kalman filtering is applied to obtain a fast convering, low complexity echo. An averaged diagonal Riccati equation allows optimal time varying adaptation gains $\bar{K}(t)$ to be precomputed, or computed online with a small number of scalar Riccati equations.

2 Claims, 1 Drawing Sheet

ECHO CANCELLER HAVING KALMAN FILTER FOR OPTIMAL ADAPTATION

This is a continuation of International Application No. PCT/SE96/00178, with an international filing date of Feb. 12, 1996, which designated the United States.

TECHNICAL FIELD

The present invention relates to an echo cancellation method of adaptive filter type in a telecommunication system.

BACKGROUND

Echo control is an important problem in telecommunication systems. In public switched telephony networks (PSTN), echo is sometimes generated in the four to two wire connections because of impedance mismatch. More precisely, the local loops between the subscriber and the switch use two wire connections, while the connections between switches use four wires. The coupling between two wire and four wire connections is performed with an electrical device called a hybrid. Ideally, the hybrid should direct all incoming signal energy from the far end (the distant speaker) to the near end terminal. Since the connection is a duplex connection it must be possible for the near end speaker to talk also when the far end speaker is talking. Unfortunately, this means that some signal energy coming from the far end can be reflected back to the far end because of impedance mismatch in the hybrid. These hybrids are numerous, and hence it is not feasible to tune them manually. The situation is symmetrical, i.e. the same effects occur at the far end when the near end is speaking.

In an attempt to solve the echo cancellation problem it has been suggested to use adaptive filters, especially filters that are updated in accordance with the NLMS algorithm. This algorithm is attractive due to its relatively low complexity. However, a drawback of the algorithm is its slow convergence.

SUMMARY

Thus, it is an object of the present invention to provide an echo cancellation method with improved convergence time and low complexity.

Such an echo cancellation method includes the step of cancelling the echo in an input signal x(t) with a Kalman filter having a time varying Kalman gain vector $\overline{K}(t)$ proportion to the vector $$(\overline{p_1}(t)x(t-1) \ldots \overline{p_n}(t)x(t-n))^T$$

where $\overline{p_i}(t)$ are the diagonal elements of a diagonal matrix $\overline{P}(t)$ satisfying a Riccati equation, i denotes the ith diagonal elements of $\overline{P}(t)$, t denotes discrete time, n denotes the number of filter taps, and T denotes transpose.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
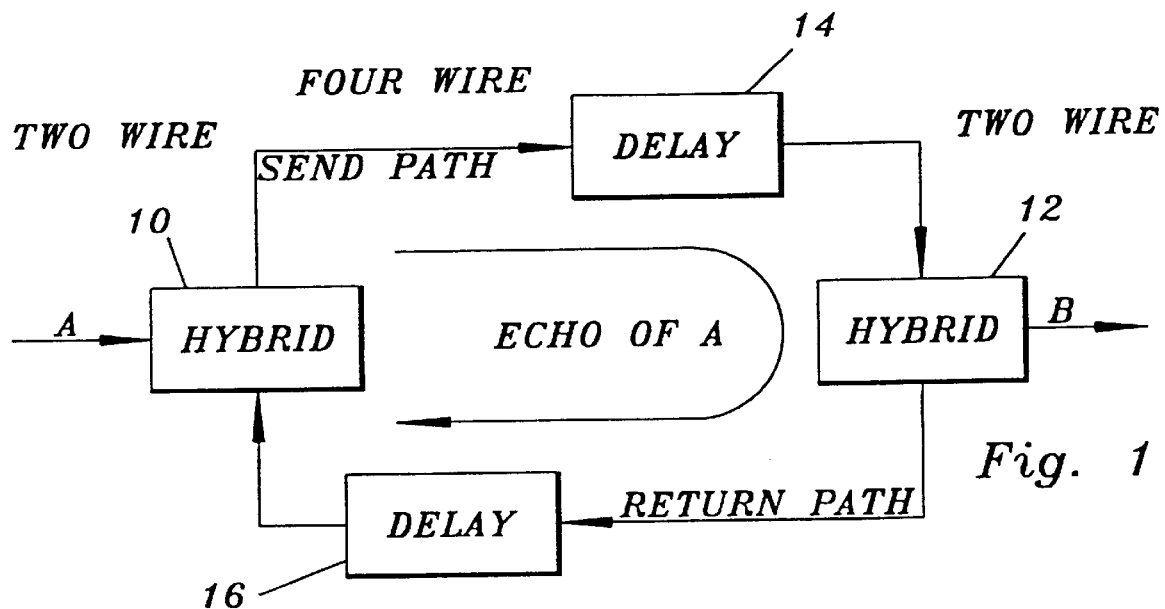
FIG. 1 is a block diagram illustrating the echo generation process.

FIG. 1 shows a block diagram illustrating the echo generation process. A speaker A talks on a two wire connection. In hybrid 10 this connection is transformed into a four wire connection, and the speech is sent to hybrid 12 on a four wire send path with a delay represented by block 14. The speech reaches listener B on the two wire connection on the other side of hybrid 12. Similarly speech from B will reach A over a four wire return path with a delay represented by block 16. However, due to impedance mismatch in hybrids 10, 12 an echo of A will also be sent back to A on the return path.

Thus, a portion of the incoming signal energy is usually reflected back to the sending side. If the loop delay is short, say less than 10–15 ms, the speaker cannot distinguish the reflected signal from the side tone of his/her terminal. However, when the loop delay is larger than 10–15 ms the speaker distinguishes an echo from the other end of the loop. Perceptually, this echo can be very annoying to listen to. If loud, it can in fact make a conversation impossible. It is to be noted that an echo can also be generated by other mechanisms in a telecommunication system. For example, in handsfree equipments for cellular phones an echo is generated by acoustic coupling between the loudspeaker and the closely located microphone [1].

The hybrid is a dynamical electric circuit, i.e it must be described mathematically as a dynamical system. This means that the reflected signal from the hybrid depends also on past incoming signals. This has important implications for the design of echo controlling equipment like echo cancellers.

Figure 2:
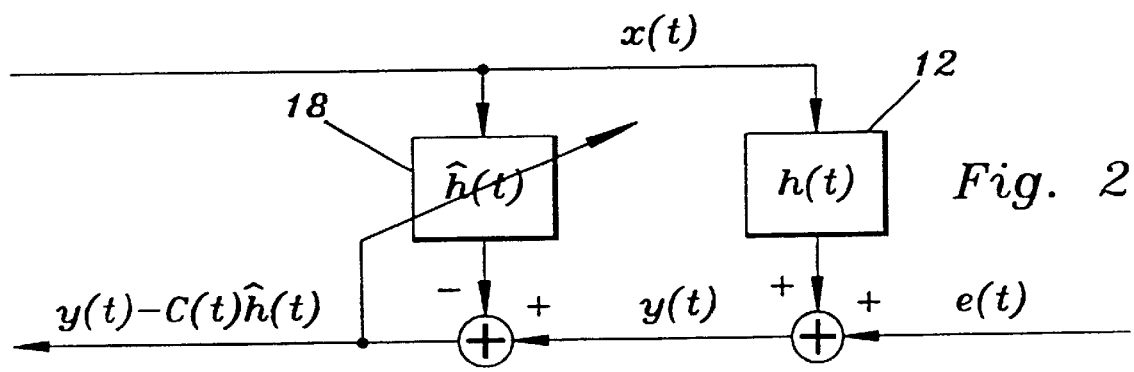
FIG. 2 is a block diagram illustrating an adaptive filter method for echo cancellation.

The basic principle of an echo canceller suitable for performing the method of the present invention is shown in FIG. 2. The idea is simply to construct a circuit that mimics the behaviour of the hybrid when excited by the signal from the far end. Since the hybrid can be accurately described by a linear dynamic system, the echo canceller is constructed as a filter. For practical reasons a time discrete finite impulse response (FIR) filter is used. The sampling rate is 8 kHz in telephony systems. Furthermore, it is common to let the filter impulse response have a maximal duration of 64 ms. This then corresponds to 512 taps in this filter.

Experiments show that hybrids have very varying impulse responses. It is therefore necessary to make the FIR filter of the echo canceller adaptive. This means that the impulse response parameters (which are equal to the tap values of the FIR filter) are adjusted by means of some mechanism that measures the residual echo y(t)–C(t)ĥ(t) of FIG. 2. The adaptation mechanism tries to adjust the taps of the FIR-filter so that the variance of the residual echo is minimized. Some common adaptation algorithms are described in the next section.

Adaptive Filtering, NLMS and Kalman Filtering

Adaptive filtering algorithms are described in detail in [2]. Here a brief summary is given.

Adaptivity is usually introduced by the minimization of a suitable loss function. It is therefore of interest to review the most common ones, i.e the steepest descent gradient search method and the more complicated second order Newton method. For that purpose consider the problem of minimizing the scalar function V(x), where x is a vector.

The steepest descent method is based on the idea to set up an iteration where the next estimate of the sought minimum equals the previous one plus a small modification in the negative gradient direction of V(x) ("downhill towards the minimum"). This gives the iteration $$x_{n+1} = x_n - \mu \frac{\partial V^T(x)}{\partial x}\bigg|_{x=x_n}. \quad (1)$$

Here $\mu$ is a constant and n denotes the iteration number. A suitable start value has to be provided by the user.

The Newton method can be understood starting with a Taylor series expansion of V(x) around the previous estimate $x_n$. Thus write $$V(x) \approx V(x_n) + \frac{\partial V(x)}{\partial x}\bigg|_{x=x_n}(x-x_n) + \frac{1}{2}(x-x_n)^T\frac{\partial^2 V(x)}{\partial x^2}\bigg|_{x=x_n}(x-x_n). \quad (2)$$

Here $^T$ denotes transpose. In the minimum, $\partial V(x)/\partial x$ should equal zero. Thus determine the next estimate $x_{n+1}$ so that this holds true, using the approximation (2). Differentiating (2) and equating the result to zero gives (using the symmetry of $\partial^2 V(x)/\partial x^2$)

$$0 = \frac{\partial V^T(x)}{\partial x}\bigg|_{x=x_{n+1}} \approx \frac{\partial V^T(x)}{\partial x}\bigg|_{x=x_n} + \frac{\partial^2 V(x)}{\partial x^2}\bigg|_{x=x_n}(x-x_n)|_{x=x_{n+1}} = \quad (3)$$

$$\frac{\partial V^T(x)}{\partial x}\bigg|_{x=x_n} + \frac{\partial^2 V(x)}{\partial x^2}\bigg|_{x=x_n}(x_{n+1}-x_n).$$

Solving for $x_{n+1}$ results in the iteration $$\left(x_{n+1} = x_n - \left(\frac{\partial^2 V(x)}{\partial x^2}\bigg|_{x=x_n}\right)^{-1}\frac{\partial V^T(x)}{\partial x}\bigg|_{x=x_n}\right) \quad (4)$$

which is the Newton iteration.

Note that above V(x) is a scalar, $\partial v(x)/\partial x$ is a vector of the same dimension as x, while $\partial^2 V(x)/\partial x^2$ is a square matrix with the number of rows and columns equal to the dimension of $$x\left(\left(\frac{\partial^2 V(x)}{\partial x^2}\bigg|_{x=x_n}\right)^{-1}\right)$$

may be viewed as a generalization of the constant scalar $\mu$ to time dependent matrix form). It is therefore well known that The Newton iteration is much more complex per iteration than the steepest descent method.

However, there is an important advantage with the Newton iteration

The Newton method converges much quicker than the steepest descent method at least close to the minimum.

The next step is then to apply the above methods for construction of adaptive FIR filtering algorithms. For that purpose a loss function must be constructed. Denote the output of the hybrid by y(t), and denote the output of the adaptive FIR filter by $\hat{y}(t,h)$. Here t denotes discrete time (t replaces the iteration index n above henceforward), and h indicates that the output of the FIR filter depends on unknown tap values $h_i$ (to be optimized by the adaptive algorithm) collected in the parameter vector h. Then the residual echo is given by $$\epsilon(t,h) = y(t) - \hat{y}(t,h). \quad (5)$$

To proceed, the FIR filter needs to be specified. It is given by $$\hat{y}(t,h) = \sum_{i=0}^{n} h_i x(t-i) = C(t)h \quad (6)$$

$$C(t) = (x(t) \ldots x(t-n)) \quad (7)$$

$$h = (h_o \ldots h_n)^T. \quad (8)$$

A loss function can now be constructed, from which a steepest descent type algorithm can be constructed. This algorithm is referred to as the least mean square algorithm (LMS) and is very common in many applications. The loss function is $$V(h) = \frac{1}{2}\epsilon^2(t,h) \quad (9)$$

where the objective is to estimate h by minimization of the error $\epsilon(t,h)$.

Since the minimization shall be performed with the algorithm (1), the following iteration is obtained $$\hat{h}(t+1) = \hat{h}(t) - \mu\frac{\partial V^T(h)}{\partial h}\bigg|_{h=\hat{h}(t)} \quad (10)$$

and hence it is necessary to compute the gradient of V(h). This can be done using (5)–(8). Consider the j:th element of the gradient vector $$\frac{\partial V(h)}{\partial h_j} = \frac{1}{2}\frac{\partial \epsilon^2(t,h)}{\partial h_j} = \frac{\partial \epsilon(t,h)}{\partial h_j}\epsilon(t,h) \quad (11)$$

$$= \frac{\partial}{\partial h_j}\left(y(n) - \sum_{i=0}^{n} h_i x(t-i)\right)\epsilon(t,h)$$

$$= -x(t-j)\epsilon(t,h).$$

Hence the j:th tap value is updated according to $$\hat{h}_j(t+1) = \hat{h}_j(t) + \mu x(t-j)\epsilon(t,h)|_{h=\hat{h}(t)}. \quad (12)$$

The gradient equations for all taps can be stacked on top of each other and formulated as the following vector, see (5)–(8)

$$\frac{\partial V^T(h)}{\partial h}\bigg|_{h=\hat{h}(t)} = -C^T(t)\epsilon(t,h)|_{h=\hat{h}(t)}. \quad (13)$$

This gives the following vector iteration that defines the LMS-algorithm $$\hat{h}(t+1) = \hat{h}(t) + \mu C^T(t)\epsilon(t,h)|_{h=\hat{h}(t)}$$

$$\hat{y}(t+1,h)|_{h=\hat{h}(t)} = C(t+1)\hat{h}(t)$$

$$\epsilon(t+1,h)|_{h=\hat{h}(t)} = y(t+1) - \hat{y}(t+1,h)|_{h=\hat{h}(t)}. \quad (14)$$

It should be noted that the updating step in the LMS-algorithm is proportional to the level of C(t) and $\epsilon(t,h)|_{h=\hat{h}(t)}$. In particular, the stability properties can be shown to depend heavily on the energy of the far end signal x(t). To avoid this, the LMS-algorithm is normally normalized with the energy of the input signal, $C(t)C^T(t)$. This gives the widely used normalized least mean square (NLMS) algorithm $$\hat{h}(t+1) = \left(\hat{h}(t) + \frac{\mu}{C(t)C^T(t)} C^T(t)\varepsilon(t, h)\right)_{h=\hat{h}(t)} \quad (15)$$

$$(\hat{y}(t+1, h)|)_{h=\hat{h}(t)} = C(t+1)\hat{h}(t)$$

$$(\varepsilon(t+1, h)|)_{h=\hat{h}(t)} = (y(t+1) - \hat{y}(t+1, h)|)_{h=\hat{h}(t)}.$$

This algorithm is state of the art in most of todays echo cancellers.

The Kalman filter can be understood as one version of the second order Newton algorithm. Its derivation is a little complicated [5], and is not reproduced here. It is sufficient for this purpose to state that for the model given in assumption A1 in the APPENDIX the Kalman filter is given by:

$$\hat{h}(t+1) = \hat{h}(t) + K(t)(y(t) - C(t)\hat{h}(t)) \quad (16)$$

$$K(t) = \frac{P(t)C^T(t)}{R_2(t) + C(t)P(t)C^T(t)} \quad (17)$$

$$P(t+1) = P(t) + R_1(t) - \frac{P(t)C^T(t)C(t)P(t)}{R_2(t) + C(t)P(t)C^T(t)}. \quad (18)$$

Here $\hat{h}(t)$ and C(t) are explained in the APPENDIX in connection to assumption A1. $R_2(t)$ is the variance of the additive noise coming from the near end (for example background noise). $R_1(t)$ is a technical so called systems noise that states how much confidence one can have in the assumption that the taps are constant, see the APPENDIX assumption A1, third equation. P(0) is the starting value of the P-equation (the Riccati equation). This quantity equals the a priori covariance of the taps $h_i$. All these quantities are assumed to be known at least at time t.

The Kalman filter starts with one iteration of (18), given P(0). This results in P(1). Then K(1) can be computed, after which $\hat{h}(2)$ can be computed assuming that $\hat{h}(1)$ is available (which it is since $\hat{h}(0)$ is provided by the user, and since K(0) follows from P(0)).

Note that in the Kalman filter P(t) is a matrix of order 512×512 if 512 taps are used in the FIR filter. Thus the complexity of the algorithm is enormous as compared to the NLMS-algorithm. But it converges optimally fast. This quick convergence is due to the fact that the gain vector K(t) (may be viewed as one individual $\mu$ for each tap) is time varying. This time variability is such that for low t, when little is known about the estimated taps, the gain is high in order to quickly obtain a rough estimate. The gain is then gradually decreased, to obtain a high accuracy and to suppress disturbances.

The present invention aims at introducing simplifications in the Kalman filter that reduce the computational complexity to a level similar to the complexity of the NLMS algorithm.

Noting that the main source of computational complexity is the Riccati equation (18), this object may be achieved as follows:

Simplifications must be introduced in the Kalman filter so that P(t) collapses to a diagonal matrix for all t. Then the complexity is reduced about 512 times for a filter length of 512 taps. These simplifications must be done in such a way that at least some of the time optimality remains in the simplified algorithms.

Exactly how to do this is outlined in the APPENDIX. The result is an algorithm of block NLMS-type with approximately optimal time variability. This gives an algorithm with either a reduced convergence time to the same echo suppression as the NLMS-algorithm, or a higher echo suppression than the NLMS-algorithm at similar convergence time from initialization.

tuning parameters that can be computed from physically meaningful quantities like echo power, echo shape, number of taps and blocks of the algorithm.

This latter property gives the following second merit of the invention:

Initially, use a nominal set of tuning parameters and let the algorithm converge. Then, after convergence more accurate estimates of echo energy and shape are available. A new and improved tuning of the algorithm can then be obtained, which in turn results in improved supression of the echo.

Heuristic Explanation of the Derivations

The development is based on [3] and [4]. In [3] a block-NLMS algorithm is introduced, where the relation between the adaptation gains $\mu$ for each block follows an exponential relation. The idea is that early taps of the impulse response are likely to be larger and more important than late taps of the impulse response. Performance can then be improved if more gain is applied to the important early taps and less to the unimportant. The reason for less gain to the unimportant small taps is that otherwise they contribute to the so called misadjustment caused by background noise equally much as the important early taps. However, they do not contribute much to the echo, and hence their equivalent SNR is low. They should therefore be less weighted (bad information) in the signal that mimics the echo from the hybrid.

To proceed with the description of the APPENDIX, first the filter model and quantities of the Kalman filter are defined. As noted, one main obstacle for the simplification of (18) is that C(t) is not known in advance and hence P(t) cannot be precomputed. The idea is then simply to take the formal statistical average over the Riccati equation, in order to obtain a precomputable quantity. The assumptions A2 and A3 express what is needed for this, and result in (20) of the APPENDIX. To proceed, additional assumptions about whiteness of the incoming far end signal are needed (A5), together with a technical assumption A4. Then, if the user choices $R_1(t)$ and P(0) are chosen according to A6 and A7, the Riccati matrix-equation (18) collapses to n scalar approximate Riccati-equations, just as intended above. However, one thing remains. An exact Riccati equation is always stable, and possesses a number of attractive features [5]. Since (22) of the APPENDIX is approximate, manipulations and further conditions are introduced in order to get (23) which is exact. The APPENDIX then computes the average Kalman gain, corresponding to (26), and introduces normalization, cf. the discussion above about LMS and NLMS.

Then the APPENDIX presents a detailed algorithm (AKFA) that is used in filter 18 in FIG. 2, and discusses how to choose the various parameters in order to achieve a good performance. First consider the algorithm. The first line initializes the energy estimate and the filter estimate. The second line introduces the initialization of the scalar Riccati equations. The third line is an estimator of the power of the incoming far end signal. The power is needed for normalization of the Kalman gain in the fifth line. The Kalman gain computation also needs the values of the different Riccati equations for each tap. These can, if preferred, be precomputed and stored in a memory. The last line of the algorithm describes the filter tap updating, corresponding to the NLMS-algorithm treated above.

It then remains to choose the quantities $\alpha$, $p_i(0)$ and $r_i$, and this is explained below the algorithm. It turns out that $p_i(0)$ can first be determined from the apriori assumed maximal echo power (Power), the number of blocks in the algorithm (m), the a priori assumed echo impulse response envelope shape (Power, δ) and the number of filter taps (n).

α is then determined from $p_1(0)$, the number of filter taps and a safety factor ($f_1$).

Finally, $r_1$ can be determined from another safety factor, $α_1$, the number of filter taps and $p_1(0)$. The $r_i$ then follow from quantities computed when determining the $p_i(0)$.

A very important observation is that all tuning parameters can be computed from quantities directly related to physical quantities like echo power, echo shape, the number of blocks of the algorithm, the filter length and two safety factors that are easy to determine. This makes the reoptimization procedure described above as one particular merit of the invention, possible.

Figure 3:
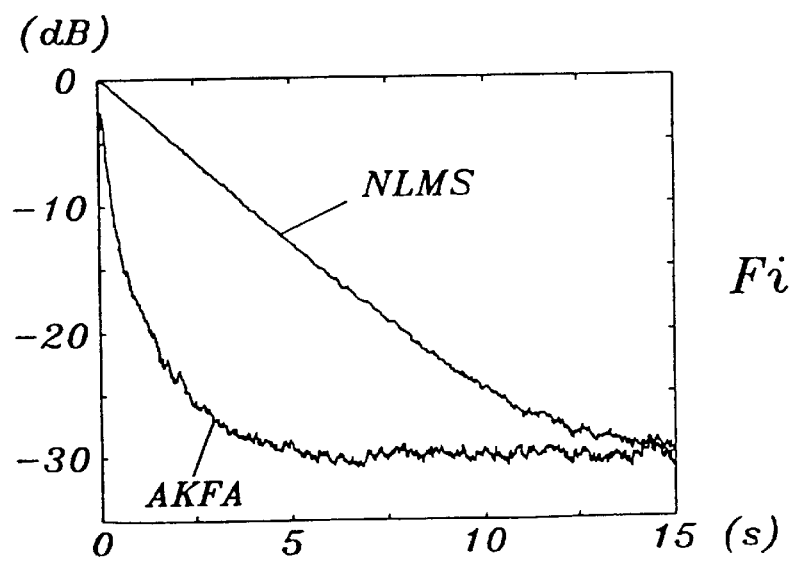
FIG. 3 is a comparison of convergence times for an echo cancellation filter operating in accordance with the prior art and in accordance with the present invention, respectively.

Experimental results show that settling time to a specified level of suppression can be reduced with a factor of 5 as compared to the conventional NLMS algorithm. FIG. 3 shows a comparison of settling times for the error signal for an NLMS algorithm and the Kalman algorithm used in the present invention, respectively. In this figure it may be seen that the error for the NLMS algorithm has converged to a steady state after approximately 15 seconds, while the error for the method in accordance with the present invention has converged to a steady state after approximately 3 seconds. (The figure has been derived from 15 seconds of speech sampled at 8000 Hz, but only every 100th error value has been shown.) The example compares the NLMS algorithm and the AKFA in terms of convergence time to a given echo suppression. x(t) was a zero mean white signal, uniformly distributed and with variance 1.00. Gaussian measurement noise was added to the simulated echo signal (generated by a real world echo impulse response) so that the SNR of y(t) was 10 dB. The NLMS algorithm used an adaptation gain of 0.01954 and n=512. The AKFA was applied to the same data using Power=0.25 (−6 dB), n=512, m=16, δ=0.001, $f_1$=1, $f_2$=0.07815 and N=512.

Alternatively, echo suppression can be improved by about 7 dB holding the settling time constant.

Both alternatives may be obtained at the expense of only a few percent increase of the computational complexity.

It will be understood by those skilled in the art that various modifications and changes may be made to the present invention without departure from the spirit and scope thereof, which is defined by the appended claims.

APPENDIX

One widely discussed problem in echo cancellation is that of the initial convergence time of the echo canceller. The problem is related to the facts that the convergence time of the conventional NLMS algorithm is limited by the spectral properties of the echo generating signal and also by the length of the estimated FIR-filter. The purpose of this appendix is to obtain a low complexity time varying matrix stepsize NLMS type algorithm, with reduced initial convergence time.

Averaged Kalman Filtering

Denote the unknown parameter vector of the adapted FIR-filter by h(t), where t is discrete time. The inputs x(t) to the echo generating system are collected in the vector C(t). To model filter initialization, it is assumed that x(t)=0, t<0. The measurements of the reflected echo are denoted by y(t) and these measurement are corrupted by noise e(t), where e(t) is white and Gaussian with zero mean and covariance $E[e(t)e(s)]=δ_{t,s}R_2$, $R_2>0$. Here E denotes expectation. The discussion is based on a random walk model that describes the evolution of h(t). The system noise w(t) is assumed to be white and Gaussian with zero mean and covariance matrix $E[w(t)w^T(s)]=δ_{t,s}R_1(t)$, $R_1(t)>0$. The Kalman filter development is thus based on the assumption:

A1: The echo generating system is described by $h(t)=(h_1(t) \ldots h_n(t))^T$ $C(t)=(x(t-1) \ldots x(t-n))$, $x(t)=0$, $t<0$ $h(t)=h(t-1)+w(t)$ $y(t)=C(t)h(t)+e(t)$ $E[e(t)e(s)]=δ_{t,s}R_2$, $E[w(t)w^T(s)]=δ_{t,s}R_1(t)$.

[5] now gives the following optimal one step predictor $$\hat{h}(t+1|t)=\hat{h}(t|t-1)+K(t)(y(t)-C(t)\hat{h}(t|t-1)). \quad (19)$$

Here K(t) is the Kalman gain that is computed from the Riccati equation [5]. C(t) is not known in advance, and hence it is necessary to iterate the full Riccati equation in real time. However, following [4], it should be possible to replace P(t) with a corresponding ensemble average, if the evolution of P(t) does not differ too much between different signal realizations. It is therefore assumed that:

A2: P(t) is a matrix valued stochastic process with an existing ensemble average $E[P(t)]=\overline{P}(t)$.

A3: $ΔP(t)=P(t)-\overline{P}(t)$ is small.

Using A2 to calculate averages of the left and right hand sides of the Riccati equation, and using A3 exactly as in [4], then give the following approximate averaged equation $$\overline{P}(t+1) = \overline{P}(t) + R_1(t) - \overline{P}(t)E\left[\frac{C^T(t)C(t)}{R_2 + C(t)\overline{P}(t)C^T(t)}\right]\overline{P}(t). \quad (20)$$

In [4] constant modulus properties of x(t) are used in order to simplify (20) further. This is not possible in the echo cancellation case, and a new approach is needed. Note that $R_1(t)/R_2 \to 0$ implies that $P(t) \to 0$ as $t \to \infty$. It is therefore reasonable to require $R_2 >> C(t)\overline{P}(t)C^T(t)$, ∀t if $R_1(t)/R_2$ is small, as expressed by A4: $R_2 >> C(t)\overline{P}(t)C^T(t)$ ∀t.

This transforms (20) to an equation where the numerator of the expectation is simplified to the scalar $R_2$, which can be taken out of the expectation. Since a low computational complexity is sought, a diagonal, precomputable approximation of $E[C^T(t)C(t)]$ would now be preferrable. This is ensured by A5: x(t) is a zero mean signal with $E[x(t)x(s)]=S(t)δ_{t,s}σ^2$.

Here S(t) is the unit step function in t=0, cf. A1. A5 is reasonable when means are included for prewhitening and bias compensation of x(t). This simplifies (20) to $$\overline{P}(t+1) = \overline{P}(t) + R_1(t) - \frac{σ^2}{R_2}\overline{P}(t)\text{diag}\{S(t-i)\}_{i=1,\ldots,n}\overline{P}(t). \quad (21)$$

To minimize complexity (21) is now reduced to a set of scalar Riccati equations by A6: $R_1(t)=\text{diag}\{r_i(t)\}_{i=1,\ldots,n}=\text{diag}\{S(t-i)r_i\}_{i=1,\ldots,n}$.

A7: $\overline{P}(0)=\text{diag}\{\overline{p}_i(0)\}_{i=1,\ldots,n}=\text{diag}\{p_i(0)\}_{i=1,\ldots,n}=P(0)$.

A6 and A7 then show that $\overline{P}(t)=\text{diag}\{\overline{p}_i(t)\}_{i=1,\ldots,n}$, ∀t, where the $\overline{p}_i(t)$ obey the scalar equations $$\bar{p}_i(t+1) = \bar{p}_i(t) + S(t-i)r_i - S(t-i)\frac{\sigma^2}{R_2}\bar{p}_i^2(t). \quad (22)$$

Since (22) is not a Riccati equation, $\bar{p}_i(t)>0$, $\forall t$ may not hold, and (22) may become unstable. However, if $R_2$ of (22) could be replaced by $R_2+S(t-i)\sigma^2\bar{p}_i(t)$, then the structure of (22) would be of Riccati type, which guarantees stability and $\bar{p}_i(t)>0$, $\forall t$ [4]. Consider A4. Note that since $\bar{P}(t)=\text{diag}\{\bar{p}_i(t)\}_{i=1,\ldots,n}$, it holds that $C(t)\bar{P}(t)C^T(t) \leq \sup_{i,t}|\bar{p}_i(t)|n\sigma^2$. Thus, if $R_2 >> \sup_{i,t}\bar{p}_i(t)|n\sigma^2$, then A4 is true and $R_2 >> S(t-i)\bar{p}_i(t)\sigma^2$. Before simplifying $R_2 >> \sup_{i,t}|\bar{p}_i(t)|n\sigma^2$ further to obtain A4', the resulting Riccati equation is stated as $$\bar{p}_i(t+1) = \bar{p}_i(t) + S(t-i)r_i - \frac{S(t-i)\sigma^2\bar{p}_i^2(t)}{R_2 + S(t-i)\sigma^2\bar{p}_i(t)}. \quad (23)$$

The assumption above can now be further modified by noting that (23) has, as $t \to \infty$, the stationary solution $$\bar{p}_i^+(r_i, R_2, \sigma) = \frac{r_i}{2} + \sqrt{\frac{r_i^2}{4} + \frac{r_i R_2}{\sigma^2}} > 0. \quad (24)$$

It is also straightforward to see from (23) that for $t \geq i$ $$\text{sign}(\bar{p}_i(t+1)-\bar{p}_i(t))=\text{sign}(\bar{p}_i^+(r_i, R_2, \sigma)-\bar{p}_i(t)). \quad (25)$$

Therefore the stability and positivity of the Riccati equation (23), together with $R_2 >> \sup_{i,t}|\bar{p}_i(t)|n\sigma^2$, (24) and (25) motivates why it is reasonable to replace A4 with A4': $R_2 >> \max_i p_i(0)n\sigma^2$ and $\max_i p_i(0) > \max_i \bar{p}_i^+(r_i, R_2, \sigma)$.

The averaged Kalman gain vector can now be computed from A1 (cf. [2],[4]). Using A2–A4' and (23) results in $$K(t) \approx \frac{\bar{P}(t)C^T(t)}{R_2 + C(t)\bar{P}(t)C^T(t)} \quad (26)$$

$$\approx \frac{1}{R_2}(\bar{p}_1(t)x(t-1) \ldots \bar{p}_n(t)x(t-n))^T = \bar{K}(t).$$

The averaged Kalman filter requires stability checking since several approximations are involved. Such stability analysis can be performed with techniques from LMS analysis, in the case where $t \to \infty$ and a stationary solution to (23) is obtained. For large t (24) and (26) then give $$\bar{K}(t) \approx \frac{1}{R_2}\left(\left(\lim_{t \to \infty}\bar{p}_1(t)\right)x(t-1) \ldots \left(\lim_{t \to \infty}\bar{p}_n(t)\right)x(t-n)\right)^T. \quad (27)$$

However, by computing $\lim_{t \to \infty}\bar{p}_i(t)/R_2$ using (24), and by LMS stability theory, the condition A8 results $$A8: \quad 0 < \max_i \left(\frac{r_i}{2R_2} + \sqrt{\left(\frac{r_i}{2R_2}\right)^2 + \frac{r_i}{R_2\sigma^2}}\right) < \frac{2}{n\sigma^2}.$$

Algorithm and Tuning

An NLMS type algorithm can now be obtained by treating $R_2$ as a design variable, and choosing it according to $$R_2 = \alpha\sigma^2. \quad (28)$$

If $N\sigma^2$ is estimated on line, the following NLMS like scheme is now obtained from A1, (19), (23), (26) and (23):

Averaged Kalman Filter Algorithm (AKFA)
The algorithm may be summarized as follows:

$$\hat{\sigma}^2(-1) = 0; \hat{h}(0|-1) = E[h(0)|-1]$$

$$\bar{p}_i(0) = p_i(0), i = 1, \ldots, n$$

$$\hat{\sigma}_N^2(t) = \begin{cases} \left[\left(1-\frac{1}{t}\right)\hat{\sigma}_N^2(t-1) + \frac{N}{t}x^2(t)\right]_{>\varepsilon, t \leq N} \\ [\hat{\sigma}_N^2(t-1) + x^2(t) - x^2(t-N)]_{>\varepsilon, t > N} \end{cases}$$

$$\bar{p}_i(t+1) = \bar{p}_i(t) + S(t-i)r_i - \frac{S(t-i)\bar{p}_i^2(t)}{\alpha + S(t-i)\bar{p}_i(t)}$$

$$\bar{K}(t) = \frac{N}{\alpha\hat{\sigma}_N^2(t)}(\bar{p}_1(t)x(t-1) \ldots \bar{p}_n(t)x(t-n))^T$$

$$C(t) = (x(t-1) \ldots x(t-n))^T, x(t) = 0, t < 0$$

$$\hat{h}(t+1|t) = \hat{h}(t|t-1) + \bar{K}(t)(y(t) - C(t)\hat{h}(t|t-1)).$$

The $\bar{p}_i(t)$ can be precomputed and stored if preferred. The check of positivity of $\hat{\sigma}_N^2(t)$ ($[\ ]_{>\varepsilon}$) prevents a possible division by zero in the computation of the Kalman gain.

The choice of $p_i(0)$ can now be discussed. Since no detailed a priori information about the impulse response is available, conventional Kalman filter theory [5] and A7 show that $E[h(0)|-1]=0$, and that $p_i(0)=E[h_i^2(0)|-1]$. As an example the following piecewise constant exponential decay of $p_i(0)$ as a function of i is now introduced as in [3]

$$p_i(0) = \beta e^{-\gamma\left[\frac{i-1}{l}\right]} \qquad l, \frac{n}{l} = m \in Z_+. \quad (29)$$

where m equals the number of piecewise constant intervals, and $[(i-1)/l]$ denotes the integer part of $(i-1)/l$. If an a priori upper bound on echo impulse response power is denoted by Power, it follows that Power equals the sum of the $p_i(0)$, $i=1 \ldots n$. Summing up the geometric series resulting from (29) and solving for $\beta$ results in $$\beta = \frac{1}{n} \text{ Power}, m = 1; \quad \beta = \frac{1}{l} \text{ Power } \frac{1-e^{-\gamma}}{1-e^{-m\gamma}}, m > 1. \quad (30)$$

where $\gamma$ can be determined by specification of the residual power at tap n as compared to tap 1, using (29). If the residual power is specified by the factor $\delta$ it follows that $\beta e^{-\gamma(m-1)}=p_n(0)=\delta p_1(0)=\delta\beta$ which gives $$\delta = 1, m = 1; \gamma = -\frac{\log(\delta)}{m-1}, m > 1. \quad (31)$$

By choosing $\delta$, n, m and Power the corresponding $p_i(0)$ can be computed. There are m different values of $p_i(0)$, which means that only m Riccati equations need to be iterated, if the $r_i$ are chosen according to the same principle as $p_i(0)$, see below. The multiplication by $S(t-i)$ can be treated by noting that, if $p_i(0)=p_{i+1}(0)$ and if $r_i=r_{i+1}$, then $\bar{p}_{i+1}(t)=\bar{p}_i(t-1)$. This reduces complexity from being proportional to 3n to being proportional to 2n+m (NLMS complexity is 2n). Since normally n>>m, this represents a reduction approaching 50%. The reduction in required ROM is larger, considering the storage of the $\bar{p}_i(t)$.

Now (28) transforms the first condition of A4' to $$\alpha = f_1 n \max_i p_i(0) = f_1 n p_1(0). \quad (32)$$

where $f_1$ is a safety factor. To determine $r_i$, first note that $\bar{p}_i^+(r_i, R_2, \sigma)$ is monotonically increasing as a function of $r_i$.

The following necessary condition for determination of the allowed range of $r_i$ then results from A4', (28) and (29)

$$\max_{r_i}\left(\frac{r_i}{2} + \sqrt{\frac{r_i^2}{4} + r_i\alpha}\right) < p_1(0). \tag{33}$$

The $r_i$ are related to the average variation rate of the i:th filter tap via the random walk model A1 since $E(h_i(t)-h_i(0))^2$ tr$_i$. The corresponding time is thus $t=p_i(0)/r_i$. It is reasonable to postulate the same average drift time to $p_i(0)$ for all taps, and (29) implies $$r_i = r_1 e^{-\gamma\left[\frac{i-1}{i}\right]}, i = 2, \ldots, n. \tag{34}$$

The stability condition A8 must also be fulfilled. It is straightforward to develop A8 using (28). The result can together with (33) and (34), be collected in $$\frac{r_1}{2} + \sqrt{\frac{r_1^2}{4} + r_1\alpha} = f_2 \min\left(\frac{2\alpha}{n}, p_1(0)\right) \tag{35}$$

where $f_2$ is a safety factor. The final result is then $$r_1 = f_2^2 \frac{\left(\min\left(\frac{2\alpha}{n}, p_1(0)\right)\right)^2}{\alpha + f_2 \min\left(\frac{2\alpha}{n}, p_1(0)\right)} \tag{36}$$

CITATIONS

[1] E. Hänsler, "The hands-free telephone problem—an annotated bibliography", Signal Processing, vol. 27, no. 3, pp. 259–271, 1992.
[2] H. Schütze and R. Zen, "Numerical characteristics of fast recursive least squares transversal adaptation algorithms—a comparative study", Signal Processing, vol. 27, no. 3, pp. 317–332, 1992.
[3] S. Makino, Y. Kaneda and N. Koizumi, "Exponentially weighted stepsize NLMS adaptive filter based on the statistics of a room impulse response", IEEE Trans. Acoust. Speech, Audio Processing, vol. 1, no. 1, pp. 101–108, 1993.
[3] L. Lindbom, "Simplified Kalman estimation of fading mobile radio channels: high performance at LMS computational load", in Proc. ICASSP, Pt. III, pp. 352–355, 1993.
[4] S. Haykin, Modern Filters, Macmillan Publishing, 1989.

What is claimed is:

1. A method of canceling an echo signal generated by an input signal x(t) in a hybrid in a telecommunication system, comprising the steps of:

filtering said input signal x(t) in a FIR Kalman filter having a time varying Kalman gain vector K(t) that determines the time varying filter taps of said filter, said gain vector K(t) being proportional to the vector $$\begin{bmatrix} \bar{p}_1(t)x(t-1) \\ \bar{p}_1(t)x(t-2) \\ \vdots \\ \bar{p}_n(t)x(t-n) \end{bmatrix}$$

where n denotes the number of filter taps, t denotes discrete time, and $\bar{p}_i(t)$, i=1 . . . n, denotes the ith diagonal element of a matrix $\bar{P}(t)$ that is diagonal for all t, is independent of said input signal x(t), and each of said diagonal elements satisfies a corresponding scalar equation of the form:

$$\bar{p}_i(t+1) = \bar{p}_i(t) + S(t-i)r_i - \frac{S(t-i)\bar{p}_i^2(t)}{\alpha + S(t-i)\bar{p}_i(t)}, \quad i = 1\ldots n$$

where $r_i$ and $\alpha$ constant parameters, and s(t-i) is the unit step function; and subtracting said filter signal from said echo signal.

2. The method of claim 1, wherein said matrix $\bar{P}(t)$ is formed by diagonal block matrices, said diagonal elements $\bar{p}_i(t)$ being the same within each block matrix.

* * * * *

UNITED STATES PATENT AND TRADEMARK OFFICE
CERTIFICATE OF CORRECTION

PATENT NO.   : 5,995,620
DATED        : November 30, 1999
INVENTOR(S)  : Torbjörn Wigren It is certified that error appears in the above-identified patent and that said Letters Patent is hereby corrected as shown below:

Column 1,
Lines 47-48, delete "proportion" and insert therefore -- proportional --.

Column 3,
Equation 4, should read as follows --

$$x_{n+1} = x_n - \left(\frac{\partial^2 V(x)}{\partial x^2}\bigg|_{x=x_n}\right)^{-1} \frac{\partial V^T(x)}{\partial x}\bigg|_{x=x_n} \qquad (4)$$

Line 36, delete "∂v(x)/∂x" and insert therefore -- ∂V(x)/∂x --
Lines 38-47, should read as follows:
-- with the number of rows and columns equal to the dimension of $\times \left(\left(\frac{\partial^2 V(x)}{\partial x^2}\bigg|_{x=x_n}\right)^{-1}\right.$
may be viewed as a generalization of the constant of the scalar $\mu$ to time dependent matrix form). It is therefore well known that --

Column 4,
Equation 11, should read as follows --

$$\frac{\partial V(h)}{\partial h_j} = \frac{1}{2}\frac{\partial \varepsilon^2(t,h)}{\partial h_j} = \frac{\partial \varepsilon(t,h)}{\partial h_j}\varepsilon(t,h)$$

$$= \frac{\partial}{\partial h_j}(y(t) - \sum_{i=0}^{n} h_i x(t-i))\varepsilon(t,h) = -x(t-j)\varepsilon(t,h). \qquad (11)$$

Column 5,
Equation 15, should read as follows --

$$\hat{h}(t+1) = \hat{h}(t) + \frac{\mu}{C(t)C^T(t)}C^T(t)\varepsilon(t,h)\big|_{h=\hat{h}(t)}$$

$$\hat{y}(t+1,h)\big|_{h=\hat{h}(t)} = C(t+1)\hat{h}(t)$$

$$\varepsilon(t+1,h)\big|_{h=\hat{h}(t)} = y(t+1) - \hat{y}(t+1,h)\big|_{h=\hat{h}(t)}.$$

UNITED STATES PATENT AND TRADEMARK OFFICE
CERTIFICATE OF CORRECTION

PATENT NO. : 5,995,620
DATED : November 30, 1999
INVENTOR(S) : Torbjörn Wigren

It is certified that error appears in the above-identified patent and that said Letters Patent is hereby corrected as shown below:

Column 9,
Line 12, delete "$R_2 >> sup_{i,t} \bar{p}_i(t) | n\sigma^2$" and insert therefore $-R_2 >> sup_{i,t} |\bar{p}_i(t)| n\sigma^2-$.

Column 10,
Line 6, should read as follows --

$$\bar{p}_i(0) = p_i(0), \; i = 1, \ldots, n$$

Line 12, should read as follows --

$$\bar{p}_i(t+1) = \bar{p}_i(t) + S(t-i)r_i - \frac{S(t-i)\bar{p}_i^2(t)}{\alpha + S(t-i)\bar{p}_i(t)}$$

Line 14, should read as follows --

$$\bar{K}(t) = \frac{N}{\alpha \hat{\sigma}_N^2(t)}(\bar{p}_1(t)x(t-1) \ldots \bar{p}_n(t)x(t-n))^T$$

Line 18, should read as follows --

$$\hat{h}(t+1|t) = \hat{h}(t|t-1) + \bar{K}(t)(y(t) - C(t)\hat{h}(t|t-1)).$$

Equation 32, should read as follows --

$$\alpha = f_1 n \max_i p_i(0) = f_1 n p_1(0). \tag{32}$$

Claim 1,
Line 16-20, should read as follows --

$$\begin{vmatrix} \bar{p}_1(t)x(t-1) \\ \bar{p}_2(t)x(t-2) \\ \cdot \\ \cdot \\ \cdot \\ \bar{p}_n(t)x(t-n) \end{vmatrix}$$

Line 38, delete "s(t - i)" and insert therefore -- S(t - i) --.

UNITED STATES PATENT AND TRADEMARK OFFICE
CERTIFICATE OF CORRECTION

PATENT NO.    : 5,995,620
DATED         : November 30, 1999
INVENTOR(S)   : Torbjörn Wigren It is certified that error appears in the above-identified patent and that said Letters Patent is hereby corrected as shown below:

ABSTRACT,
Line 2, after "echo" insert -- canceller --.

Signed and Sealed this

Twenty-second Day of January, 2002

Attest:

Attesting Officer

JAMES E. ROGAN
Director of the United States Patent and Trademark Office